(12) United States Patent
Wu

(10) Patent No.: US 11,561,732 B2
(45) Date of Patent: Jan. 24, 2023

(54) METHOD AND APPARATUS AND COMPUTER PROGRAM PRODUCT FOR CONFIGURING RELIABLE COMMAND

(71) Applicant: Silicon Motion, Inc., Zhubei (TW)

(72) Inventor: Po-Wei Wu, New Taipei (TW)

(73) Assignee: SILICON MOTION, INC., Zhubei (TW)

( * ) Notice: Subject to any disclaimer, the term of this patent is extended or adjusted under 35 U.S.C. 154(b) by 35 days.

(21) Appl. No.: 17/169,032

(22) Filed: Feb. 5, 2021

(65) Prior Publication Data

US 2022/0011975 A1 Jan. 13, 2022

(30) Foreign Application Priority Data

Jul. 8, 2020 (CN) .......................... 202010653300.5

(51) Int. Cl.
*G06F 3/06* (2006.01)
*G11C 16/20* (2006.01)
*G06F 13/20* (2006.01)
*G06F 13/16* (2006.01)

(52) U.S. Cl.
CPC .......... *G06F 3/0659* (2013.01); *G06F 3/0604* (2013.01); *G06F 3/0679* (2013.01); *G06F 13/1668* (2013.01); *G06F 13/20* (2013.01); *G11C 16/20* (2013.01)

(58) Field of Classification Search
None
See application file for complete search history.

(56) References Cited

U.S. PATENT DOCUMENTS

| 6,076,161 | A | * | 6/2000 | Ho | G06F 9/30189 713/1 |
| 7,047,462 | B2 | * | 5/2006 | Brown | G01R 31/318572 714/724 |
| 8,924,634 | B2 | * | 12/2014 | Lin | G06F 12/0246 712/227 |
| 9,520,184 | B2 | * | 12/2016 | Yang | G11C 16/0483 |

(Continued)

FOREIGN PATENT DOCUMENTS

| CN | 102707969 A | 10/2012 |
| CN | 109976666 A | 7/2019 |
| TW | 201945928 A | 12/2019 |

OTHER PUBLICATIONS

English translation of the Taiwanese Search Report, dated Aug. 30, 2021, for Taiwanese Application No. 109122978.

*Primary Examiner* — Elias Mamo
(74) *Attorney, Agent, or Firm* — Birch, Stewart, Kolasch & Birch, LLP

(57) ABSTRACT

The invention introduces a method for configuring a reliable command, performed by a flash controller, including: issuing an enabling signal to an output device, where the flash controller and the output device are disposed on a printed circuit board (PCB) and intercoupled through wires in the PCB; reading an opcode of the reliable command corresponding to a flash module from the output device, where the flash module is disposed on the PCB and coupled to the flash controller through circuits in the PCB, and the reliable command is used to direct the flash module for access to data in a single level cell (SLC) mode; and stopping issuing the enabling signal to the output device after obtaining the opcode of the reliable command.

17 Claims, 8 Drawing Sheets

(56) References Cited

U.S. PATENT DOCUMENTS

| | | | |
|---|---|---|---|
| 2008/0172521 A1* | 7/2008 | Lee .................... | G11C 11/5628 |
| | | | 711/E12.008 |
| 2018/0307558 A1* | 10/2018 | Chen ................... | G06F 12/0246 |
| 2019/0102109 A1* | 4/2019 | Kim .................... | G11C 7/1066 |
| 2019/0206494 A1 | 7/2019 | Han et al. | |
| 2021/0191662 A1 | 6/2021 | Chen | |

* cited by examiner

METHOD AND APPARATUS AND COMPUTER PROGRAM PRODUCT FOR CONFIGURING RELIABLE COMMAND

CROSS-REFERENCE TO RELATED APPLICATIONS

This application claims the benefit of priority to Patent Application No. 202010653300.5, filed in China on Jul. 8, 2020; the entirety of which is incorporated herein by reference for all purposes.

BACKGROUND

The disclosure generally relates to storage devices and, more particularly, to a method, an apparatus, and a computer program product for configuring reliable command.

Flash memory devices typically include NOR flash devices and NAND flash devices. NOR flash devices are random access—a central processing unit (CPU) accessing a NOR flash device can provide the device any address on its address pins and immediately retrieve data stored in that address on the device's data pins. NAND flash devices, on the other hand, are not random access but serial access. It is not possible for NAND to access any random address in the way described above. Instead, the CPU has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word.

The NAND flash device includes a flash module and a flash controller. The flash controller receives host commands issued by the CPU. The flash controller reads designated data from the flash module, writes designated data into the flash module and erases designated data according to the parameters carried in the host commands, such as command types, addresses, etc. The flash controller may operate the flash module produced by different manufacturers, and the operation codes (opcodes) of reliable commands defined by different manufacturers may be different. Even the opcodes of reliable commands defined by the same manufacturer for different generations of flash modules may be different. After the NAND flash device is powered on, the flash controller first needs to know the opcode of the reliable command defined by the connected flash module to proceed to subsequent operations. Thus, it is desirable to have a method, an apparatus, and a computer program product for configuring the reliable command to obtain the opcode of the reliable command defined in the connected flash module dynamically.

SUMMARY

In an aspect of the invention, an embodiment introduces a method for configuring a reliable command, performed by a flash controller, including: issuing an enabling signal to an output device, where the flash controller and the output device are disposed on a printed circuit board (PCB) and intercoupled through wires in the PCB; reading an opcode of the reliable command corresponding to a flash module from the output device, where the flash module is disposed on the PCB and coupled to the flash controller through circuits in the PCB, and the reliable command is used to direct the flash module for access to data in a single level cell (SLC) mode; and stopping issuing the enabling signal to the output device after obtaining the opcode of the reliable command.

In another aspect of the invention, an embodiment introduces a non-transitory computer program product for configuring a reliable command when executed by a processing unit of a flash controller. The non-transitory computer program product includes program code to perform the operations of the method for configuring a reliable command as described above.

In still another aspect of the invention, an embodiment introduces an apparatus for configuring a reliable command, including: a flash controller, disposed on a PCB; and an output device, disposed on the PCB, and coupled to the flash controller through circuits in the PCB. The output device includes multiple gates. An input terminal of each gate is connected to a power plane or a ground plane in the PCB through a first conductive wire, an output terminal of each gate is connected to one corresponding data pin of the flash controller through a second conductive wire, and each gate is enabled by an enabling signal.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
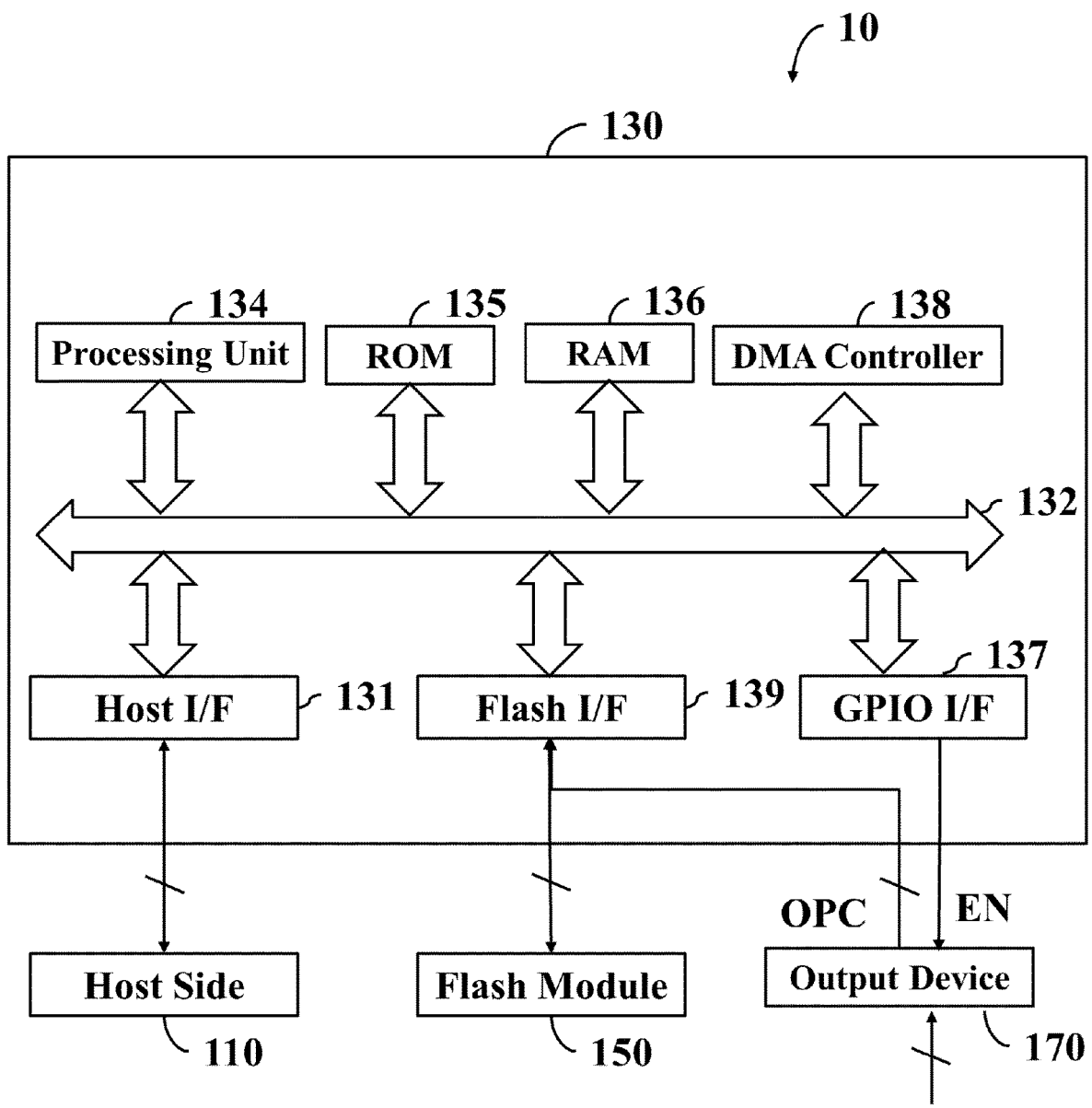
FIG. 1 is the system architecture of an electronic apparatus according to an embodiment of the invention.

Refer to FIG. 1. The electronic apparatus 100 includes a host side 110, a flash controller 130 and a flash module 150, and the flash controller 130 and the flash module 150 may be collectively referred to as a device side. The electronic apparatus 100 may be equipped with a Personal Computer (PC), a laptop PC, a tablet PC, a mobile phone, a digital camera, a digital recorder, or other consumer electronic products. The host 110 and the host interface (I/F) 131 of the flash controller 130 may communicate with each other by Universal Serial Bus (USB), Advanced Technology Attachment (ATA), Serial Advanced Technology Attachment (SATA), Peripheral Component Interconnect Express (PCI-E), Universal Flash Storage (UFS), Embedded Multi-Media Card (eMMC) protocol, or others. The flash I/F 139 of the flash controller 130 and the flash module 150 may communicate with each other by a Double Data Rate (DDR) protocol, such as Open NAND Flash Interface (ONFI), DDR Toggle, or others. The flash controller 130 includes the processing unit 134 and the processing unit 134 may be implemented in numerous ways, such as with general-purpose hardware (e.g., a single processor, multiple processors or graphics processing units capable of parallel computations, or others) that is programmed using firmware and/or software instructions to perform the functions recited herein. The processing unit 134 may receive host commands from the host side 110 through the host I/F 131, such as read commands, write commands, erase commands, etc., schedule and execute the host commands. The flash controller 130 includes the Read Only Memory (ROM) 135 for storing the bootcode, which is the first code executed when the device side is turned on. The flash controller 130 includes the Random Access Memory (RAM) 136, which may be implemented in a Dynamic Random Access Memory (DRAM), a Static Random Access Memory (SRAM), or the combination thereof, for allocating space as a data buffer storing user data (also referred to as host data) that has been obtained from the host side 110 and is to be programmed into the flash module 150, and that has been read from the flash module 150 and is to be output to the host side 110. The RAM 136 stores necessary data in execution, such as variables, data tables, data abstracts, host-to-flash (H2F) tables, flash-to-host (F2H) tables, or others. The flash I/F 139 includes a NAND flash controller (NFC) to provide functions that are required to access to the flash module 150, such as a command sequencer, a Low Density Parity Check (LDPC) encoder/decoder, etc.

The flash controller 130 may be equipped with the bus architecture 132 to couple components to each other to transmit data, addresses, control signals, etc. The components include but not limited to the host I/F 131, the processing unit 134, the ROM 135, the RAM 136, the general-purpose input/output (GPIO) I/F 137, the direct memory access (DMA) controller 138 and the flash I/F 139.

The DMA controller 138 moves data between the components through the bus architecture 132 according to the instructions issued by the processing unit 134. For example, the DMA controller 138 may migrate data in a specific data buffer of the host I/F 131 or the flash I/F 139 to a specific address of the RAM 136, migrate data in a specific address of the RAM 136 to a specific data buffer of the host I/F 131 or the flash I/F 139, and so on.

The flash module 150 provides huge storage space typically in hundred Gigabytes (GBs), or even several Terabytes (TBs), for storing a wide range of user data, such as high-resolution images, video files, etc. The flash module 150 includes control circuits and memory arrays containing memory cells, such as being configured as Single Level Cells (SLCs), Multi-Level Cells (MLCs), Triple Level Cells (TLCs), Quad-Level Cells (QLCs), or any combinations thereof. The processing unit 134 programs user data into a designated address (a destination address) of the flash module 150 and reads user data from a designated address (a source address) thereof through the flash I/F 139. The flash I/F 139 may use several electronic signals including a data line, a clock signal line and control signal lines for coordinating the command, address and data transfer with the flash module 150. The data line may be used to transfer commands, addresses, read data and data to be programmed; and the control signal lines may be used to transfer control signals, such as Chip Enable (CE), Address Latch Enable (ALE), Command Latch Enable (CLE), Write Enable (WE), etc.

Figure 2:
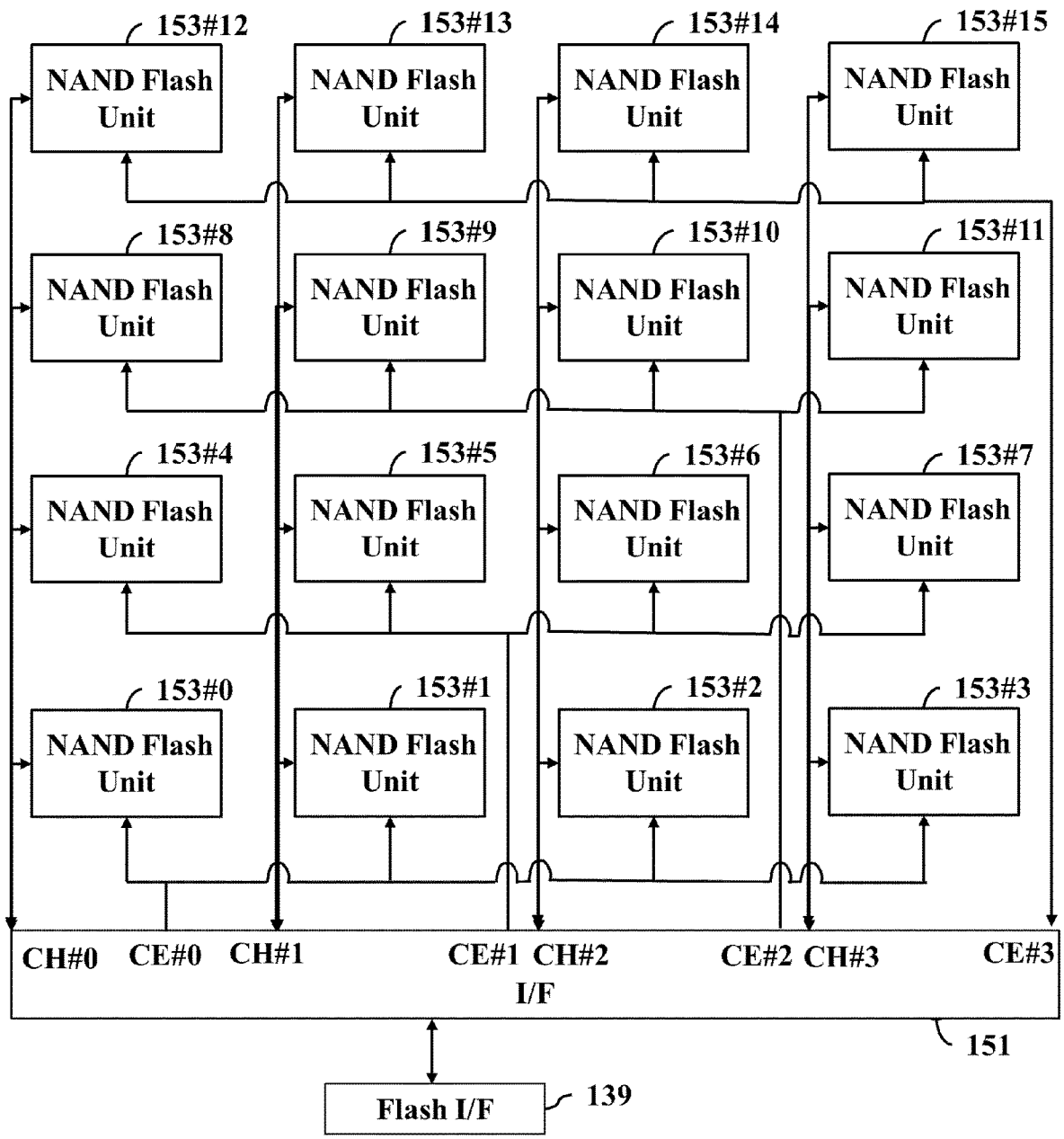
FIG. 2 is a schematic diagram illustrating a flash module according to an embodiment of the invention.

Refer to FIG. 2. The I/F 151 of the flash module 150 may include four I/O channels (hereinafter referred to as channels) CH #0 to CH #3 and each is connected to four NAND flash modules, for example, the channel CH #0 is connected to the NAND flash units 150 #0, 150 #4, 150 #8 and 150 #12. Each NAND flash unit can be packaged in an independent die. The flash I/F 139 may issue one of the CE signals CE #0 to CE #3 through the I/F 151 to activate the NAND flash modules 153 #0 to 153 #3, the NAND flash modules 153 #4 to 153 #7, the NAND flash modules 153 #8 to 153 #11, or the NAND flash modules 153 #12 to 153 #15, and read data from or program data into the activated NAND flash modules in parallel.

Figure 3:
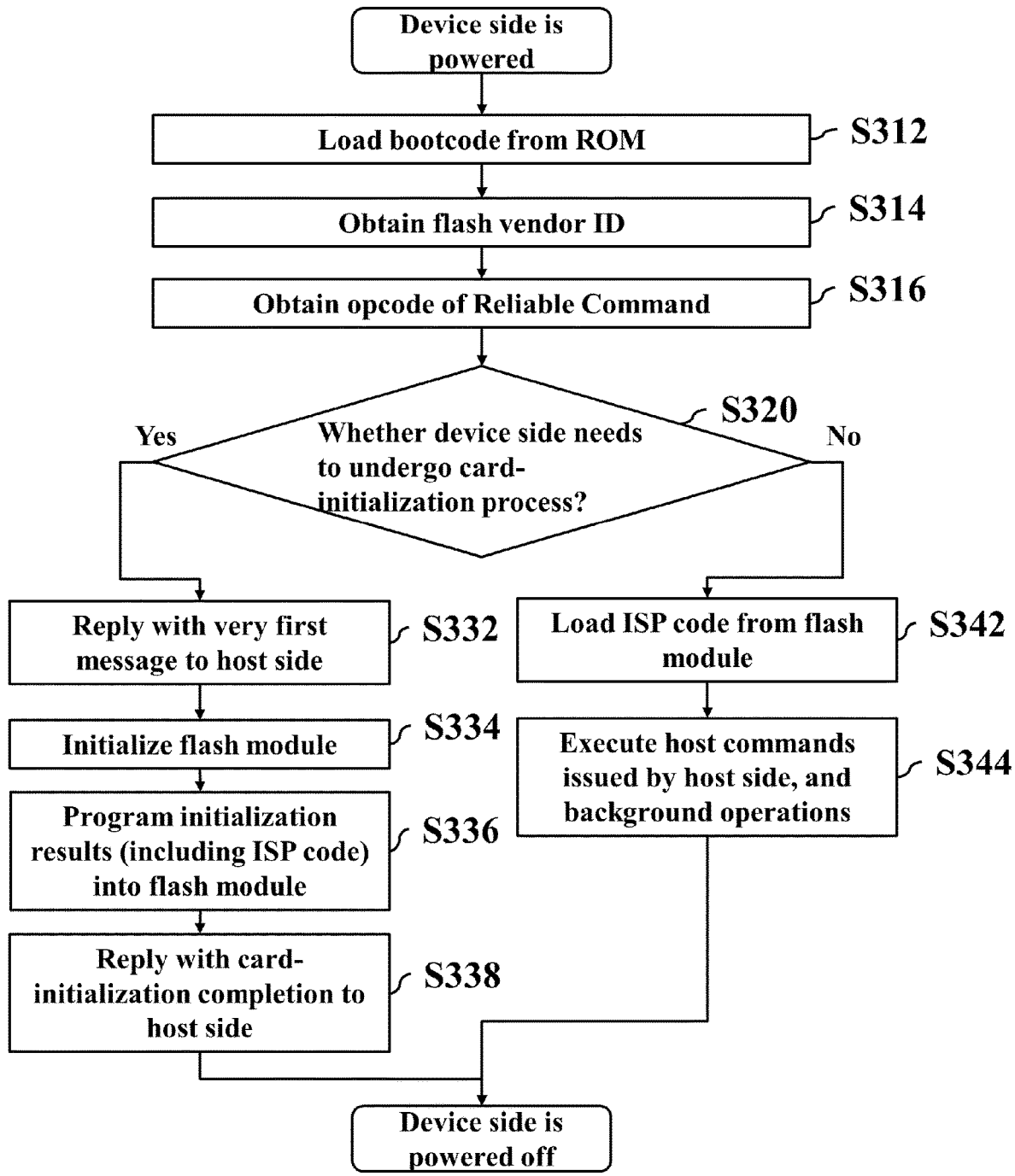
FIG. 3 is flowchart illustrating a method for operating a flash device according to some implementations.

After the flash controller 130 and the flash module 150 are disposed on the motherboard, a card-initialization process needs to be completed before the device side can be shipped and provided to a client. During the production of device side, the host side 110 may be a card-initiation host. When a customer plugs the device side into or installs the device side in an electronic apparatus, and starts to use it, the host side 110 may be a PC, a laptop PC, a tablet PC, a mobile phone, a digital camera, a digital recorder, or other consumer electronic products. Refer to FIG. 3 showing a flowchart of a method for operating a flash device, performed by the processing unit 134 of the flash controller 130. Details are described as follows:

Step S312: After the device side is powered on, the bootcode is loaded from the ROM 135 and stored in the RAM 136. The operations of steps S314, S320, S332 to S338, and S342 are performed when the processing unit 134 executes the bootcode.

Step S314: The flash vendor ID of the flash module 150 is obtained. The flash module 150 may be produced by a flash supplier, such as Intel, Micron, Toshiba, Hynix, etc., and conform to the specification of a technical generation. The processing unit 134 may drive the flash I/F 139 to issue the Read ID command "90h" with the address "00h" to the flash module 150 to obtain the flash vendor ID from the flash module 150.

Step S316: The opcode of the reliable command defined in the flash module 150 is obtained. It is to be noted here that the opcodes of reliable commands used to drive flash modules in different generations, which are produced by different flash vendors, are mostly different. The reliable command is used to direct the flash module 150 for access to data in the SLC mode.

Step S320: It is determined whether the device side needs to undergo the card-initialization process. If so, it means that the device side hasn't completed the card-initialization operations (i.e. it is still on the production line), and the process proceeds to step S332. Otherwise, it means that the device side has completed the card-initialization operations (i.e. it has left the factory and entered the normal use state), and the process proceeds to step S342.

Step S332: The very first message is replied to the host side 110 to indicate that the device side has connected to the host side 110 physically.

Step S334: The flash module 150 is initialized according to a series of vendor commands issued by the host side. The processing unit 134 may perform a series of tests to the flash module 150 through the flash I/F 139 for discovering bad blocks, bad columns, or others, and generating a bad-block table, a bad-column table, or others accordingly. The processing unit 134 may calculate the length of each physical page that can be used to store the Error Check and Correction (ECC) code based on parameters, such as the detected number of bad columns, etc. The processing unit 134 may calculate the start position of each sector of each physical page based on information, such as the detected number of bad columns, the ECC length, etc., and generate a sector start table accordingly. The processing unit 134 may calculate a logical block address (LBA) quantity for the storage of the flash module 150 according to information, such as the detected bad-block number, the detected bad-column number, the ECC length, etc. The processing unit 134 may store information about the tables, variables, and others, as described above in the RAM 136. Those artisans will realize that the aforementioned information, such as the data tables, the variables, etc., is system information that is used by the In-System Programming (ISP) code in the future execution.

Step S336: The initialization results (including the ISP code) are programmed into the flash module 150. The processing unit 134 may drive the flash I/F 139 to program the information that is temporarily stored in the RAM 136 as described in step S334 into the preset system block in the flash module 150. The processing unit 134 may further download proper ISP code from a designated location and drive the flash I/F 139 to program the ISP code into the designated address in the flash module 150. The ISP code includes a wide range of operations for executing the host commands issued by the host side 110. The host commands are the commands specified by the standards-making organizations, such as host read, write, erase commands, etc.

Step S338: The card-initialization completion is replied to the host side 110.

Operations recited in steps S332 to S338 may be referred to as the card-initialization operations collectively.

Step S342: The ISP code is loaded from the designated address in the flash module 150 and stored in the RAM 136. The operations recited in step S344 as described in the following may be performed when the processing unit 134 executes the ISP code.

Step S344: The host commands issued by the host side 110, and the background operations are executed until the device side is powered off. The background operations include such as the garbage collection, the wear levelling, the read refresh, the read reclaim processes, etc.

Operations recited in steps S342 to S344 may be referred to as the normal-mode operations collectively.

Figure 4:
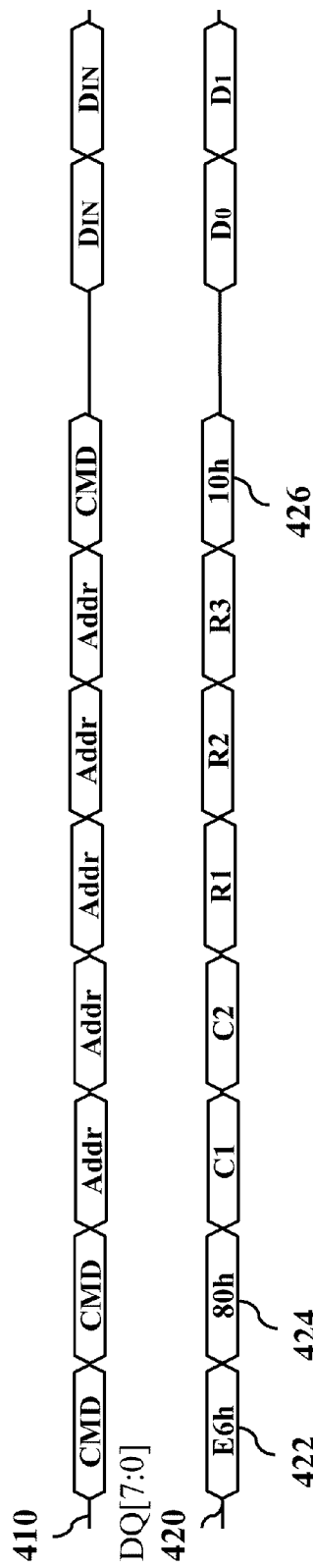
FIG. 4 is a timing diagram for programming data in the SLC mode according to an embodiment of the invention.

In step S336, the processing unit 134 needs to use the SLC mode to program the initialization results into the designated addresses in the flash module 150. For the data-programming operation in the SLC mode, refer to FIG. 4. The waveform 410 shows cycle types for data lines DQ[7:0] coupled between the flash module 150 and the flash I/F 139, where one "CMD" cycle indicates the reliable command sent from the flash I/F 139, one "CMD" cycle indicates a main command sent from the flash I/F 139, five "Addr" cycles indicate a physical address in the flash module 150 to be programmed sent from the flash I/F 139, one "CMD" cycle indicates a conform command sent from the flash I/F 139, and "$D_{IN}$" cycles indicate data sent from the flash I/F 139 in sequence. The waveform 420 shows an exemplary data-programming operation in the SLC mode, where the reliable command is "E6h", the main command is "80h", and the confirm command is "10h".

Figure 5:
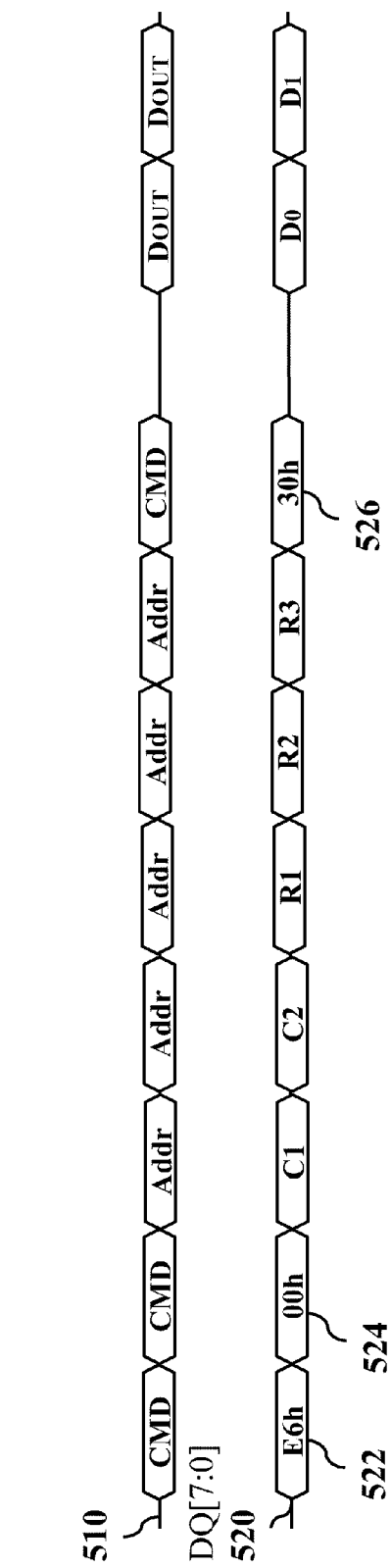
FIG. 5 is a timing diagram for reading data in the SLC mode according to an embodiment of the invention.

In step S342, the processing unit 134 needs to use the SLC mode to read the ISP code and the system information referenced by the ISP code from the flash module 150. For the data-read operation in the SLC mode, refer to FIG. 5. The waveform 510 shows cycle types for data lines DQ[7:0] coupled between the flash module 150 and the flash I/F 139, where one "CMD" cycle indicates the reliable command sent from the flash I/F 139, one "CMD" cycle indicates a main command sent from the flash I/F 139, five "Addy" cycles indicate a physical address in the flash module 150 to be read sent from the flash I/F 139, one "CMD" cycle indicates a conform command sent from the flash I/F 139, and "$D_{OUT}$" cycles indicate data sent from the flash module 150 in sequence. The waveform 520 shows an exemplary data-read operation in the SLC mode, where the reliable command is "E6h", the main command is "00h", and the confirm command is "30h".

In some implementations for step S316, the manufacturer of the flash controller 130 may embed the opcodes of reliable commands corresponding to different generations of flash modules produced by different vendors into the logic of the bootcode, so that the bootcode can obtain the opcode of the reliable command corresponding to the flash module 150 according to the flash vendor ID obtained in step S314, and other information. The opcode of the reliable command may be represented in one byte, such as "0xDA", "0x3B", "0xA2", "0xE6", etc. However, if an opcode of the reliable command corresponding to a new flash vendor, or a new generation of flash module does not record in the logic of the bootcode, these already-made flash controller 130 cannot be mounted with the newly emerged flash modules, resulting in inflexible production.

Figure 6:
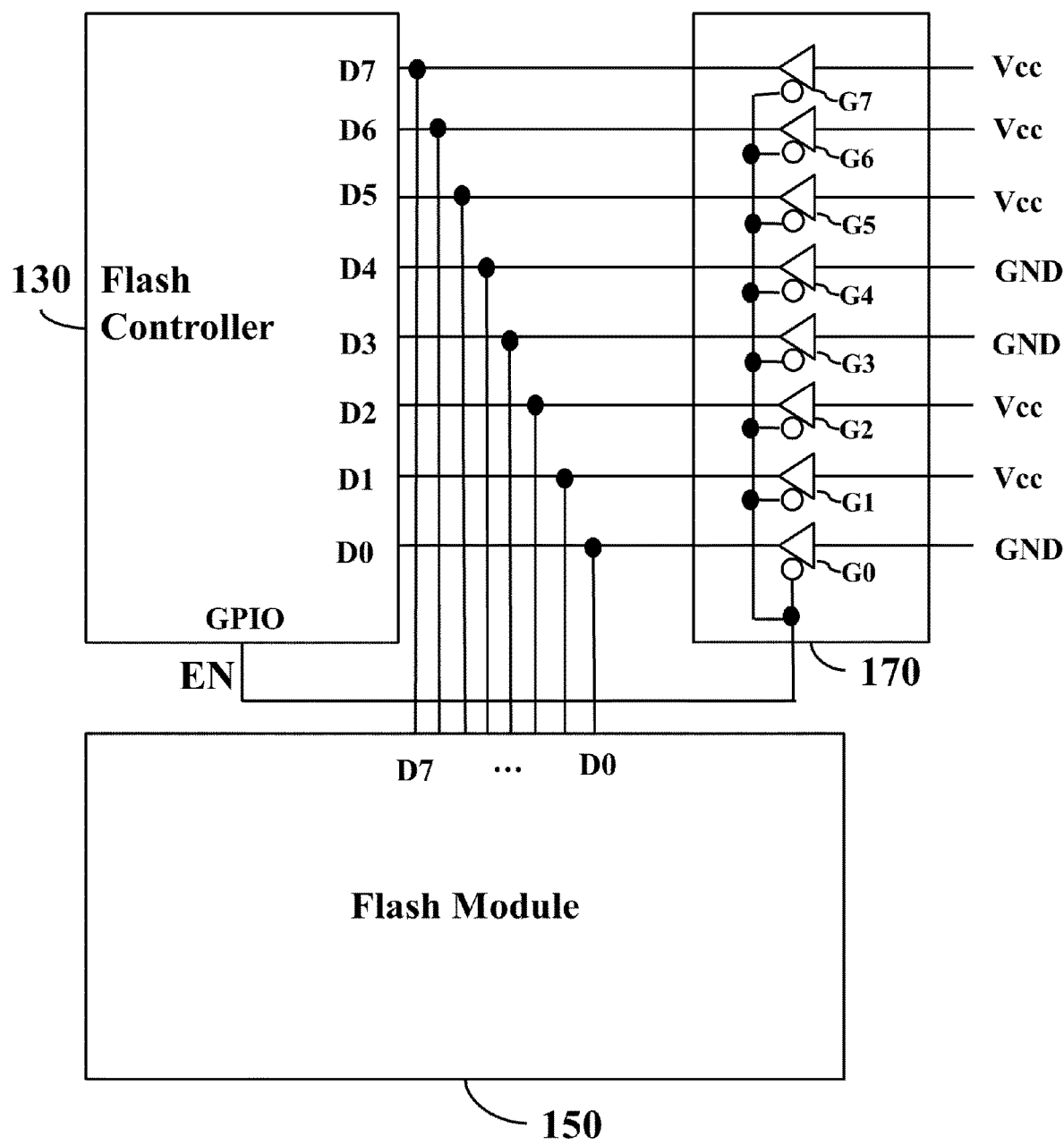
FIG. 6 is a schematic diagram of a flash controller, a flash module and an output device according to an embodiment of the invention.

Some embodiments introduce a hardware solution. A device side includes a printed circuit board (PCB). The flash controller 130, the flash module 150 and the output device 170 are disposed on the PCB and intercoupled or interconnected through wires in the PCB. Refer to FIG. 6. The output device 170 includes multiple gates G7 to G0, the input terminal of each gate is connected to the power plane (notated by Vcc) or the ground plane (notated by GND) in the PCB through a conductive wire, and the output terminal of each gate is connected to one corresponding data pin of the flash controller 130 through a conductive wire. For example, the output terminal of the gate G0 is connected to the data pin D0 through a conductive wire, the output terminal of the gate G1 is connected to the data pin D1 through a conductive wire, and so on. The gates G7 to G0 may be realized by switches, D Flip-Flops, or other equivalent circuits. The flash controller 130 issues the enabling signal (notated by EN) through the GPIO pin to all gates G7 to G0 in the output device 170, so that each gate being enabled outputs the corresponding signal to the flash controller 130. The gates G7 to G0 being not enabled are in the high impedance state and cannot output any signal. When the input terminal of any gate being enabled is connected to the power plane, the corresponding gate outputs logic "1" to the corresponding data pin. When the input terminal of any gate being enabled is connected to the ground plane, the corresponding gate outputs logic "0" to the corresponding data pin. It is to be noted that the PCB manufacturer connects the input terminal of each gate of the output device to the designated power plane or ground plane through a conductive wire in the production of the device side. After the PCB is produced completely, the connectivity between the input terminals of all gates in the output device 170 and the planes in the PCB cannot be changed. The connectivity between the input terminals of all gates in the output device 170 and the planes in the PCB is associated with the opcode of the reliable command required by the flash module 150, for example, "0xE6". In other words, when the output device 170 is enabled, the gates G7 to G0 output "b11100110" to the data pins D7 to D0 in the flash controller 130, collectively. The data pins D7 to D0 in the flash controller 130 are also connected to the data pins D7 to D0 in the flash module 150 through conductive wires in the PCB, respectively.

Although the embodiment of the output device 170 in FIG. 6 describes 8-bit data input and output, those artisans may extend the output device 170 to 16-bit, 32-bit, or another number of bits data input and output depending on different system requirements, the invention should not be limited thereto. Although the gates G7 to G0 in FIG. 6 are low active gates, those artisans may modify the gates G7 to G0 with high active gates, and the invention should not be limited thereto.

Figure 7:
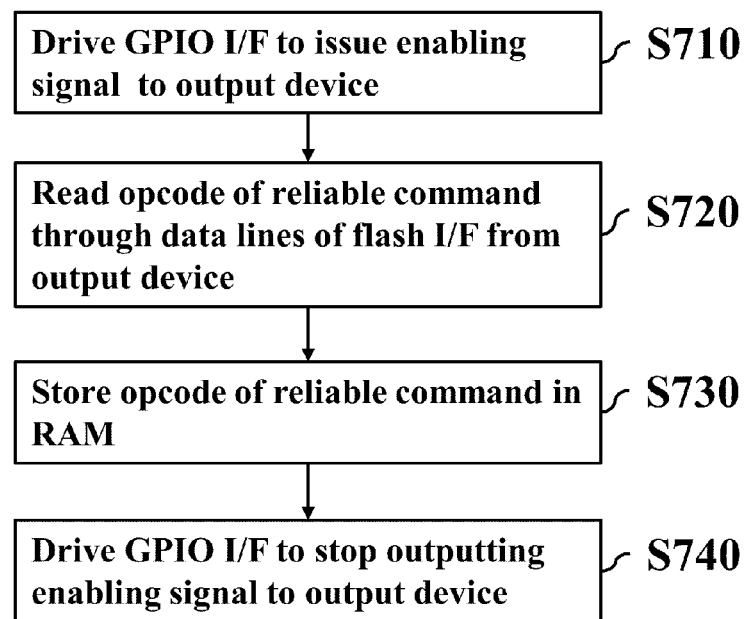
FIG. 7 is a flowchart illustrating a method for obtaining an opcode of a reliable command accompanying with a hardware solution according to an embodiment of the invention.

In order to match the hardware solution as described above, the bootcode may be modified. Refer to FIG. 7 showing a flowchart of a method for obtaining the opcode of the reliable command, performed by the processing unit 134 when loading and executing the bootcode. The method as illustrated in FIG. 7 corresponds to step S316 in FIG. 6 and includes operation details accompanying with the hardware solution. Details are described as follows:

Step S710: The GPIO I/F 137 is driven to issue the enabling signal EN to the output device 170.

Step S720: The opcode OPC of the reliable command is read through the data lines of the flash I/F 139 from the output device 170.

Step S730: The opcode of the reliable command is stored in the RAM 136, so that the reliable command is issued to the flash module 150 according to the opcode stored in the RAM 136 during the data programming and the data reading recited in steps S336 and S342.

Step S740: After the opcode OPC of the reliable command is obtained, the GPIO I/F 137 is driven to stop issuing the enabling signal EN to the output device 170 to release the control of the data lines, so that the data lines can be used to transmit commands, addresses, data, and so on, between the flash controller 130 and the flash module 150.

Alternative embodiments introduce a protocol solution. In step S314, the Read ID command is used to request the flash module 150 to provide the flash vendor ID for recognizing information regarding the manufacturer, the technical generation, and the like of the flash module 150. In the new solution, the flash module 150 replies with 8-byte data after receiving the Read ID command, in which six bytes record the flash vendor ID and two bytes are reserved. The flash module 150 may provide the opcode of the reliable command in the reserved two bytes. That is, the flash module 150 appends the opcode of the reliable command to the flash vendor ID and replies with both to the flash controller 130. In order to conform to the protocol solution, the output device 170 is removed from the system architecture as shown in FIG. 1.

Figure 8:
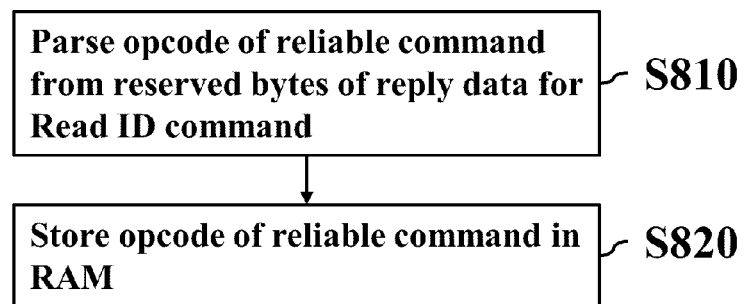
FIG. 8 is a flowchart illustrating a method for obtaining an opcode of a reliable command accompanying with a protocol solution according to an embodiment of the invention.

In order to match the protocol solution as described above, the bootcode may be modified. Refer to FIG. 8 showing a flowchart of a method for obtaining the opcode of the reliable command, performed by the processing unit 134 when loading and executing the bootcode. The method as illustrated in FIG. 8 corresponds to step S316 in FIG. 6 and includes operation details accompanying with the protocol solution. Details are described as follows:

Step S810: The opcode OPC of the reliable command is parsed from the reserved bytes in the reply data for the Read ID command.

Step S820: The opcode of the reliable command is stored in the RAM 136, so that the reliable command is issued to the flash module 150 according to the opcode stored in the RAM 136 during the data programming and the data reading recited in steps S336 and S342.

Some or all of the aforementioned embodiments of the method of the invention may be implemented in a computer program such as a driver for a dedicated hardware, a Firmware Translation Layer (FTL) of a storage device, or others. Other types of programs may also be suitable, as previously explained. Since the implementation of the various embodiments of the present invention into a computer program can be achieved by the skilled person using his routine skills, such an implementation will not be discussed for reasons of brevity. The computer program implementing some or more embodiments of the method of the present invention may be stored on a suitable computer-readable data carrier such as a DVD, CD-ROM, USB stick, a hard disk, which may be located in a network server accessible via a network such as the Internet, or any other suitable carrier.

Although the embodiment has been described as having specific elements in FIGS. 1, 2, and 6, it should be noted that additional elements may be included to achieve better performance without departing from the spirit of the invention. Each element of FIGS. 1, 2, and 6 is composed of various circuits and arranged to operably perform the aforementioned operations. While the process flows described in FIGS. 3, 7, and 8 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for configuring a reliable command, performed by a flash controller, comprising:

issuing an enabling signal to an output device to direct the output device to output an operation code (opcode) of the reliable command corresponding to a flash module to the flash controller, wherein the flash controller and the output device are disposed on a printed circuit board (PCB) and intercoupled through wires in the PCB;

reading the opcode of the reliable command corresponding to the flash module from the output device, wherein the flash module is disposed on the PCB and coupled to the flash controller through circuits in the PCB, the flash module and the output device are separated, and the reliable command is used by the flash controller to direct the flash module for access to data in a single level cell (SLC) mode; and stopping issuing the enabling signal to the output device after obtaining the opcode of the reliable command, wherein the output device comprises a plurality of gates, an input terminal of each gate is connected to a power plane or a ground plane in the PCB through a first conductive wire, an output terminal of each gate is connected to one corresponding data pin of the flash controller through a second conductive wire, and each gate is enabled by the enabling signal.

2. The method of claim 1, wherein the enabling signal is issued to the output device through a general-purpose input/output interface.

3. The method of claim 1, comprising:

sending the opcode to the flash module for directing the flash module to program an in-system programming (ISP) code and system information in the SLC mode, wherein the system information is used by the ISP code when being executed.

4. The method of claim 1, comprising:

sending the opcode to the flash module for directing the flash module to read an in-system programming (ISP) code and system information in the SLC mode, wherein the system information is used by the ISP code when being executed.

5. The method of claim 1, wherein when the input terminal of any gate of the output device being enabled is connected to the power plane, the corresponding gate outputs logic "1"; when the input terminal of any gate of the output device being enabled is connected to the ground plane, the corresponding gate outputs logic "0"; and the gates of the output device being not enabled are in a high impedance state and cannot output any signal.

6. The method of claim 1, wherein the output device when being enabled outputs the opcode of the reliable command.

7. A non-transitory computer program product for configuring a reliable command when executed by a processing unit of a flash controller, the non-transitory computer program product comprising program code to:

issue an enabling signal to an output device to direct the output device to output an operation code (opcode) of the reliable command corresponding to a flash module to the flash controller, wherein the flash controller and the output device are disposed on a printed circuit board (PCB) and intercoupled through wires in the PCB;

read the opcode of the reliable command corresponding to the flash module from the output device, wherein the flash module is disposed on the PCB and coupled to the flash controller through circuits in the PCB, the flash module and the output device are separated, and the reliable command is used by the flash controller to direct the flash module for access to data in a single level cell (SLC) mode; and stop issuing the enabling signal to the output device after obtaining the opcode of the reliable command, wherein the output device comprises a plurality of gates, an input terminal of each gate is connected to a power plane or a ground plane in the PCB through a first conductive wire, an output terminal of each gate is connected to one corresponding data pin of the flash controller through a second conductive wire, and each gate is enabled by the enabling signal.

8. The non-transitory computer program product of claim 7, wherein the enabling signal is issued to the output device through a general-purpose input/output interface.

9. The non-transitory computer program product of claim 7, comprising program code to:

send the opcode to the flash module for directing the flash module to program an in-system programming (ISP) code and system information in the SLC mode, wherein the system information is used by the ISP code when being executed.

10. The non-transitory computer program product of claim 7, comprising program code to:

send the opcode to the flash module for directing the flash module to read an in-system programming (ISP) code and system information in the SLC mode, wherein the system information is used by the ISP code when being executed.

11. The non-transitory computer program product of claim 7, wherein when the input terminal of any gate of the output device being enabled is connected to the power plane, the corresponding gate outputs logic "1"; when the input terminal of any gate of the output device being enabled is connected to the ground plane, the corresponding gate outputs logic "0"; and the gates of the output device being not enabled are in a high impedance state and cannot output any signal.

12. The non-transitory computer program product of claim 7, wherein the output device when being enabled outputs the opcode of the reliable command.

13. An apparatus for configuring a reliable command, comprising:

a flash controller, disposed on a printed circuit board (PCB); and an output device, disposed on the PCB, coupled to the flash controller through circuits in the PCB, comprising a plurality of gates, arranged operably to output an operation code (opcode) of the reliable command corresponding to a flash module to the flash controller when being enabled, wherein an input terminal of each gate is connected to a power plane or a ground plane in the PCB through a first conductive wire, an output terminal of each gate is connected to one corresponding data pin of the flash controller through a second conductive wire, and each gate is enabled by an enabling signal, wherein the reliable command is used by the flash controller to direct the flash module for access to data in a single level cell (SLC) mode.

14. The apparatus of claim 13, wherein when the input terminal of any gate of the output device being enabled is connected to the power plane, the corresponding gate outputs logic "1"; when the input terminal of any gate of the output device being enabled is connected to the ground plane, the corresponding gate outputs logic "0"; and the gates of the output device being not enabled are in a high impedance state and cannot output any signal.

15. The apparatus of claim 14, comprising:
the flash module, disposed on the PCB and coupled to the flash controller through circuits in the PCB,
wherein a connectivity between the input terminals of the gates and the power and ground planes in the PCB is associated with the opcode of the reliable command.

16. The apparatus of claim 15, wherein the connectivity between the input terminals of the gates and the power and ground planes in the PCB cannot be changed after the PCB is produced completely.

17. The apparatus of claim 13, wherein the output device is enabled through a general-purpose input/output interface.

* * * * *